United States Patent
Magnoux

(10) Patent No.: US 12,309,958 B2
(45) Date of Patent: May 20, 2025

(54) OFFSET NETWORK CARD COMPUTING BLADE

(71) Applicants: BULL SAS, Les Clayes-sous-bois (FR); Le Commissariat à l'énergie atomique et aux énergies alternatives (CEA), Paris (FR)

(72) Inventor: Sébastien Magnoux, Mery-sur-Oise (FR)

(73) Assignees: BULL SAS, Les Clayes-sous-Bois (FR); Le Commissariat à l'énergie atomique et aux énergies alternatives (CEA), Paris (FR)

( * ) Notice: Subject to any disclaimer, the term of this patent is extended or adjusted under 35 U.S.C. 154(b) by 125 days.

(21) Appl. No.: 18/364,768

(22) Filed: Aug. 3, 2023

(65) Prior Publication Data
US 2024/0074081 A1    Feb. 29, 2024

(30) Foreign Application Priority Data

Aug. 31, 2022  (EP) ................... 22306290

(51) Int. Cl.
*H05K 7/20* (2006.01)
*H05K 7/14* (2006.01)

(52) U.S. Cl.
CPC ......... *H05K 7/1487* (2013.01); *H05K 7/1491* (2013.01); *H05K 7/20154* (2013.01); *H05K 7/20254* (2013.01)

(58) Field of Classification Search
CPC ............... H05K 7/1487; H05K 7/1491; H05K 7/20154; H05K 7/20254; H05K 7/20772; H05K 7/20509; G06F 1/183; G06F 1/185; G06F 2200/201; G06F 1/20
See application file for complete search history.

(56) References Cited

U.S. PATENT DOCUMENTS

| | | | | |
|---|---|---|---|---|
| 10,485,143 | B2* | 11/2019 | Gao | H05K 7/20781 |
| 10,905,030 | B1* | 1/2021 | Fernandes | H05K 7/20836 |
| 11,832,417 | B2* | 11/2023 | Chen | H05K 7/20772 |
| 2018/0341301 | A1* | 11/2018 | Shabbir | G06F 1/206 |
| 2020/0117250 | A1* | 4/2020 | Lengefeld | G06F 1/20 |
| 2022/0229798 | A1 | 7/2022 | Lambert et al. | |

FOREIGN PATENT DOCUMENTS

EP    3500079 A1    6/2019

OTHER PUBLICATIONS

Search Report issued in EP22306290.2 on Feb. 23, 2023 (6 pages).

* cited by examiner

*Primary Examiner* — Anthony M Haughton
*Assistant Examiner* — Hung Q Dang
(74) *Attorney, Agent, or Firm* — ARC IP Law, PC; Joseph J. Mayo

(57) ABSTRACT

A computing blade for a liquid-cooled supercomputer, including as many network cards as there are processors, each network card being associated with a processor. Each network card includes a plug-in end that receives a connector, and each network card allows data communication between the processor and another processor. Each network card is mounted to the cold plate being connected to the motherboard via a connection system that includes a first connector, connected to the plug-in end of the network card, and a second connector, connected on the one hand to the first connector via a cable and on the other hand to the motherboard.

15 Claims, 3 Drawing Sheets

OFFSET NETWORK CARD COMPUTING BLADE

This application claims priority to European Patent Application Number 22306290.2, filed 31 Aug. 2022, the specification of which is hereby incorporated herein by reference.

BACKGROUND OF THE INVENTION

Technical Field of the Invention

At least one embodiment of the invention is directed to the field of supercomputers and more particularly relates to a liquid-cooled computing blade for supercomputer as well as a supercomputer comprising at least one such computing blade.

Description of the Related Art

A HPC (High Performance Computing) computer, or supercomputer, consists of a plurality of computing blades in the form of modules inserted into a bay. Each computing blade comprises a motherboard comprising a plurality of processors each configured to process data. Each computing blade also includes high-speed network cards, for example, of the Ethernet® mezzanine type (OCP3 card), to allow communication between the computing blades and the use of the power from several processors to perform a same task. To be functional, each of these network cards should be connected to the motherboard.

In air-cooled HPC computers, the conventional connection system is made card-to-card, that is the network card is guided in a mechanical chassis up to the motherboard connector and insertion is made manually or using an insertion lever.

In liquid-cooled HPC computers, the motherboard is mounted on one side of the cold plate, through which heat sinks for cooling the processors are mounted. However, such a configuration can make insertion and board-to-board connection of network cards with the motherboard particularly complex, especially due to the lack of space around the motherboard. In addition, each network card should have a thermal interface with the cold plate through which the cooling liquid flows in order to cool the network card. The traditional card-to-card connection is therefore unsatisfactory for this type of computing blade and there is therefore a need for a simple and effective solution that can at least partially remedy these drawbacks.

BRIEF SUMMARY OF THE INVENTION

To this end, a first object of at least one embodiment of the invention is a computing blade for multi-computing blade supercomputer, the computing blade comprising a motherboard, comprising a plurality of processors mounted to a support, and a cold plate, dimensioned to cover the support of the processors and comprising a plurality of heat sinks, a cooling circuit comprising channels inside which a so-called "cold" heat transfer fluid circulates, for supplying the heat sinks, and a discharge circuit comprising channels inside which a so-called "hot" heat transfer fluid circulates, which has been heated up through the heat sinks, each heat sink being mounted in line with a processor in order to cool it by heat exchange, the computing blade comprising as many network cards as processors, each network card being associated with a processor, each network card comprising a plug-in end configured to receive a connector, each network card being configured to allow data communication between the processor and another processor of the computing blade or another computing blade, the computing blade being remarkable in that each network card is mounted to the cold plate by being connected to the motherboard via a connection system, the system comprising a first connector, connected to the plug-in end of the network card, and a second connector, connected on the one hand to the first connector via a cable and on the other hand to the motherboard.

The liquid-cooled computing blade according to one or more embodiments of the invention enables electrical connection of the network cards to the motherboard via the connection systems. The connection system of a network card thus makes it possible to connect the network card to the motherboard remotely via a cable so that the network cards can be offset from the motherboard while ensuring that they are cooled by the cold plate. The network cards can thus be placed on the opposite side of the cold plate to the main board in a place with sufficient space. The computing blade according to one or more embodiments of the invention therefore makes it possible to optimize the space available on both sides of the cold plate, in particular by making the placement of the network cards independent of the placement of the motherboard by virtue of the remote connection system between the motherboard and the network cards. The cable and connector connection system also makes it easy to connect and disconnect the network cards from the motherboard. The offset of the network cards from the motherboard can also make it easy to change a network card in case of maintenance when the network cards are mounted in an easily accessible place of the computing blade.

In at least one embodiment, the cable of the connection system is flexible to facilitate positioning and connection of the first connector and the second connector.

In at least one embodiment, the second connector is connected to the motherboard through the cold plate in order to access the motherboard by the shortest path and thus optimize the space occupied by the blade and its components. Alternatively or in addition, by way of one or more embodiments, all or part of the second connectors could be connected to the motherboard by cables bypassing the cold plate by one or more of its edges.

Advantageously, in one or more embodiments, each network card is mounted to the cold plate via a support piece, in particular so as to allow the use of standard commercially available network cards.

In at least one embodiment, the support piece comprises a body and a device for holding the first connector, mounted to the body, in order to hold the connector in an optimized connected position and thus prevent it from moving during transport or when using the computing blade.

In at least one embodiment, the holding device comprises a blade for supporting the first connector and a plate for holding the first connector on the support blade.

Advantageously, by way of one or more embodiments, the support blade is made of metal, preferably aluminum, in order to withstand high temperatures to which the components internal to the computing blade can be subjected while being inexpensive.

Still advantageously, by way of at least one embodiment, the holding plate is made of metal, preferably steel, to withstand high temperatures to which the components internal to the computing blade can be subjected while being inexpensive.

According to at least one embodiment of the invention, the holding plate is attached to the support blade with at least one screw, preferably with two screws, in order to effectively block the first connector in the connected position in the holding device.

In one or more embodiments, the at least one screw is captive.

In at least one embodiment, the at least one captive screw is mounted at the holding plate, so that it does not escape when transporting or attaching or removing the first connector.

In one or more embodiments, the support blade is attached to the support piece body by being offset by a distance from the cold plate in order to adapt position of the first connector at the plug-in end of the network card.

Advantageously, by way of at least one embodiment, the body of the support piece is made of a thermal energy conducting material, preferably aluminum, in order to allow efficient cooling of the network card.

In at least one embodiment, each network card is attached on an edge of the computing blade, preferably a same edge, by an attachment end, opposite to the plug-in end. Network cards can then be easily connected to a communication network via Ethernet®-type cables.

At least one embodiment of the invention also relates to a server, in particular a supercomputer, comprising at least one computing blade as set forth above.

BRIEF DESCRIPTION OF THE DRAWINGS

Further characteristics and advantages of the invention will further appear upon reading the description that follows. This is purely illustrative and should be read in conjunction with the appended drawings in which.

DETAILED DESCRIPTION OF THE INVENTION

Figure 1:
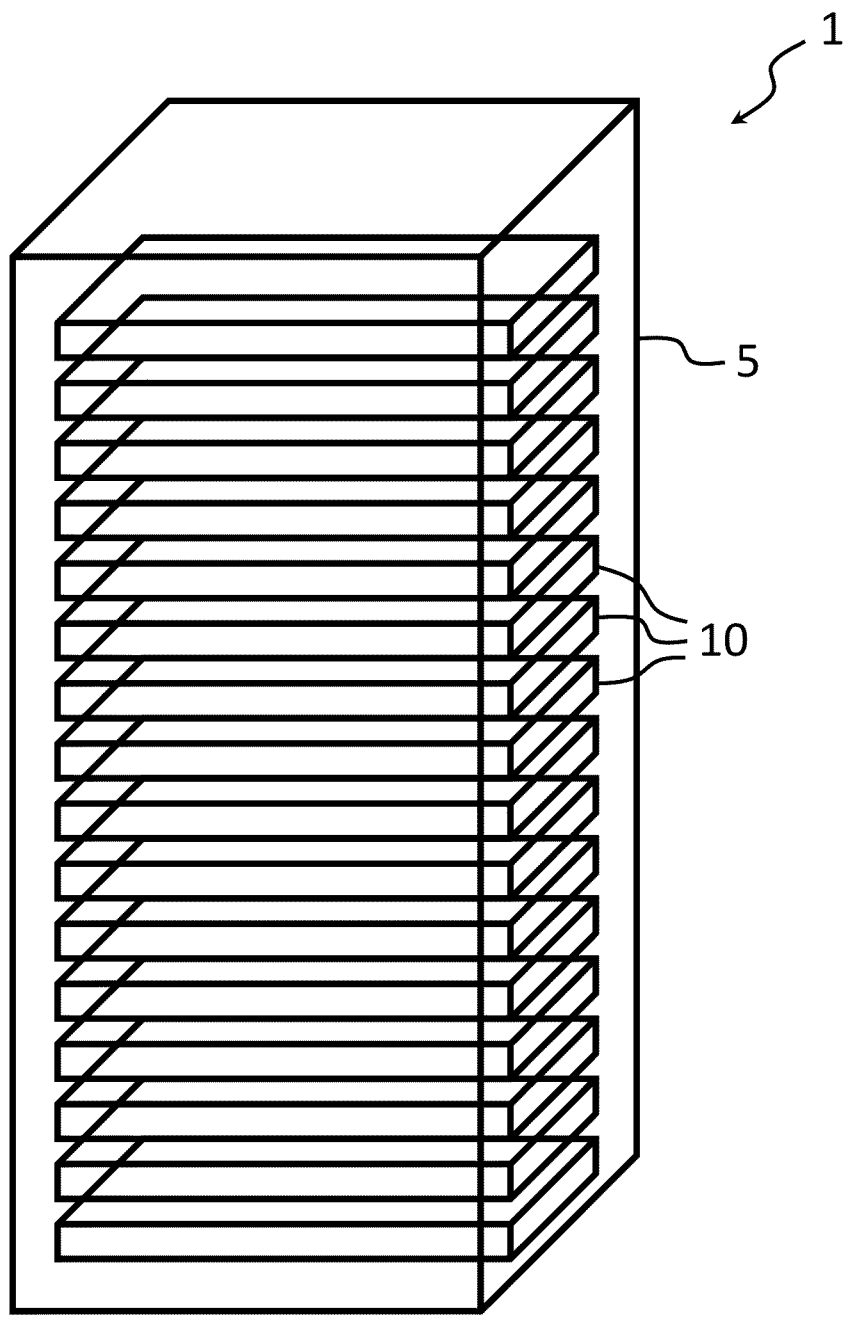
FIG. 1 schematically illustrates in transparency the supercomputer according to one or more embodiments of the invention.

FIG. 1 illustrates one example of a supercomputer 1 according to one or more embodiments of the invention.

Supercomputer 1

The supercomputer 1 comprises a bay 5 in which a plurality of computing blades 10 according to one or more embodiments of the invention are mounted. In this non-limiting example, the computing blades 10 are mounted by being superimposed on each other vertically, for example on guide rails.

More generally, the supercomputer 1 could be a server or any type of computer bay in which it is necessary to mount at least one liquid-cooled multiprocessor computing module.

Computing Blade 10

Figure 2:
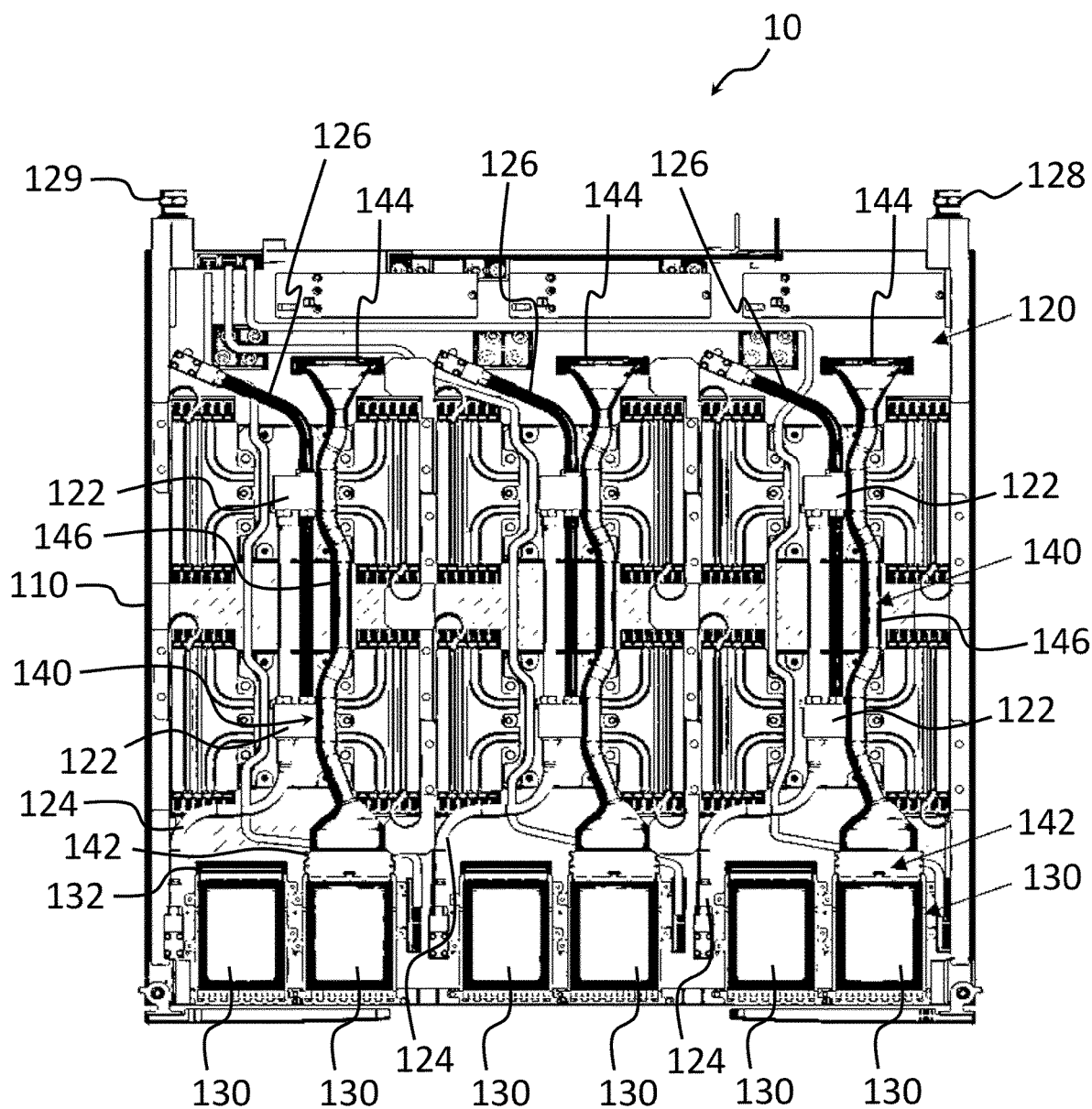
FIG. 2 schematically illustrates a computing blade of the supercomputer of FIG. 1, according to one or more embodiments of the invention.

FIG. 2 illustrates one exemplary computing blade 10 according to one or more embodiments of the invention.

The computing blade 10 first comprises a motherboard 110 and a cold plate 120.

Motherboard 110

The motherboard 110 comprises a plurality of processors (not visible as under the cold plate 120) mounted to a support (also not visible as under the cold plate 120).

Cold Plate 120

The cold plate 120 is dimensioned to cover the support of the processors and comprises a plurality of heat sinks 122, a cooling circuit 124, a discharge circuit 126, a so-called "cold" inlet connector 128 and a so-called "hot" outlet connector 129.

The cooling circuit 124 comprises channels inside which a so-called "cold" heat transfer fluid circulates, entering the cooling circuit 124 via the cold inlet connector 128 and which is for supplying the heat sinks 122.

Each heat sink 122 is mounted in line with a processor to cool it by heat exchange.

The discharge circuit 126 comprises channels inside which a so-called "hot" heat transfer fluid that has heated up through the heat sinks 122 and which is discharged through the hot outlet connector 129 circulates.

The computing blade 10 then comprises a plurality of network cards 130. More precisely, by way of at least one embodiment, the computing blade 10 comprises as many network cards 130 as there are processors, each network card 130 being associated with a processor.

Each network card 130 includes a plug-in end 132 configured to receive a connector and is configured to allow data communication between the processor to which the network card 130 is associated and another processor of the computing blade 10 or another computing blade 10 (of the supercomputer 1 or another supercomputer) via the plug-in end 132.

Each network card 130 is mounted to the cold plate 120 by being connected to the motherboard 110 via a connection system 140.

The connection system 140 comprises a first connector 142, a second connector 144 and a cable (or a wire harness) 146 electrically connecting the first connector 142 to the second connector 144.

The first connector 142 is connected to the plug-in end 132 of the network card 130. The second connector 144 is connected on the one hand to the first connector 142 via the cable 146 and on the other hand to the motherboard 110.

In the example of FIG. 2, according to one or more embodiments of the invention, the second connector 144 is connected to the motherboard 110 through the cold plate 120 in order to access the motherboard 110 by a short path and thus optimize the space occupied by the computing blade 10 and its components.

The cable 146 is flexible so that it can conform to the space formed between the heat sinks 122 and the connection direction both of the first connector 142 (in this case in parallel to the plane along which the cold plate 120 extends) and of the second connector 144 (in this case orthogonally to the plane along which the cold plate 120 extends).

Figure 3:
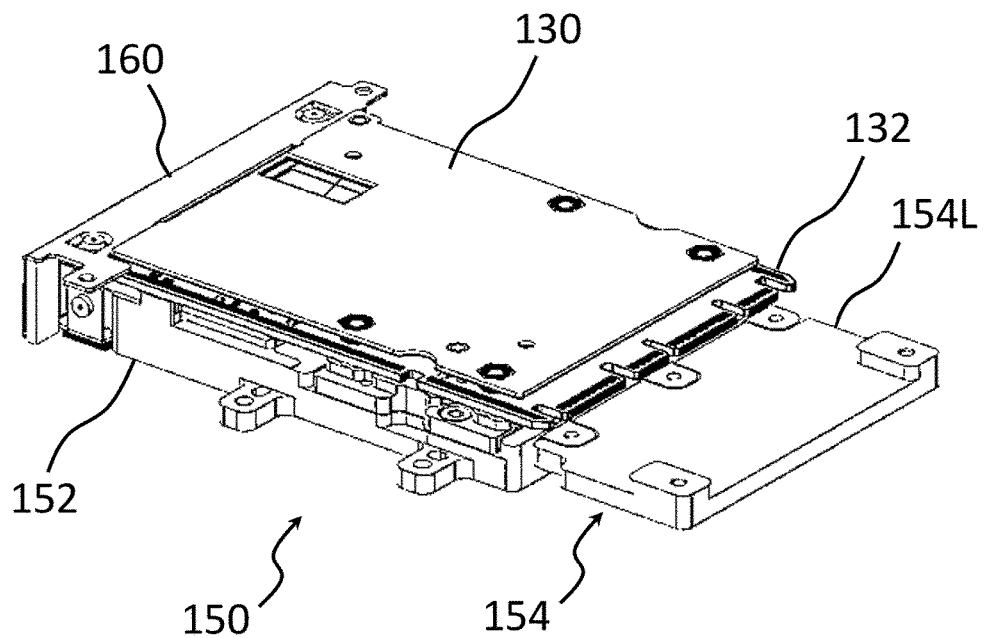
FIG. 3 schematically illustrates a network card mounted to a support piece of the blade of FIG. 2, according to one or more embodiments of the invention.

Each network card 130 is mounted to the cold plate 120 by means of a support piece 150, as illustrated in FIG. 3.

The support piece 150 comprises a body 152 and a holding device 154 mounted to the body 152 and configured to hold the first connector 142 when the first connector 142 is connected to the plug-in end 132 in order to prevent the first connector 142 from moving when transporting or using the computing blade 10. In other words, in at least one embodiment, the holding device 154 makes it possible to hold the connector in the connected position on the plug-in end 132 in an optimized manner.

Figure 4:
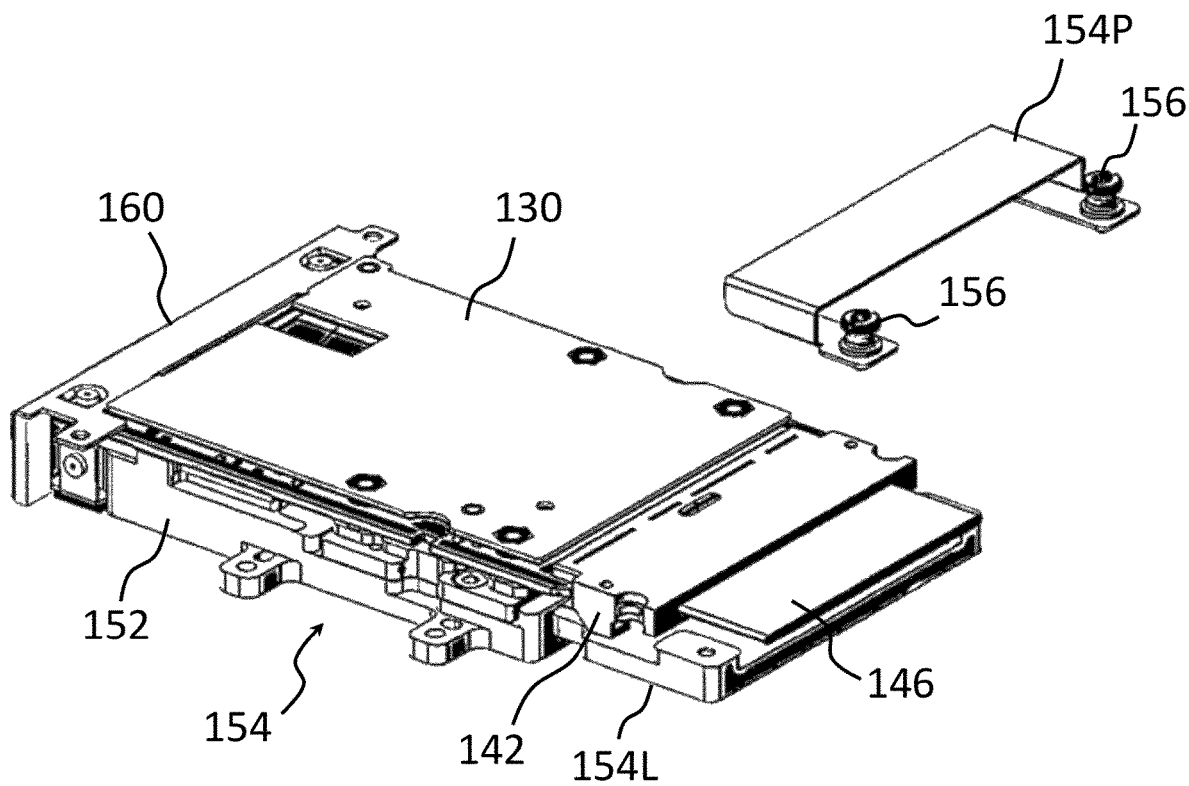
FIG. 4 schematically illustrates the support piece and the network card of FIG. 2, to which the first connector is connected in a partial view, according to one or more embodiments of the invention.

Withe reference to FIG. 4, by way of one or more embodiments, the holding device 154 comprises a support blade 154L and a holding plate 154P. The support blade 154L receives the first connector 142 while the holding plate 154P blocks the first connector 142 on the support blade 154L.

In at least one embodiment of the invention, the support blade 154L is made of metal, preferably aluminum to conduct thermal energy. In one or more embodiments, the holding plate 154P is also made of metal, preferably steel.

Still with reference to FIG. 4, by way of at least one embodiment, the holding plate 154P is attached to the support blade 154L with two screws 156 in order to block the first connector 142.

Each screw 156 is mounted at the holding plate 154P by being captive, that is the screw is free to rotate to screw onto the support blade 154L but is retained on the holding plate 154P so as to prevent it from escaping when transporting and attaching or removing the first connector 142.

The support blade 154L is attached to the body 152 of the support piece 150 and extends in parallel to the cold plate 120 by being offset by a distance from the cold plate 120.

The body 152 of the support piece 150 is made of a thermal energy conducting material, for example aluminum, in order to allow cooling of the network card 130 by the thermal energy provided by the heat transfer fluid circulating in the cold plate 120.

With reference to FIG. 2, by way of at least one embodiment, each network card 130 is attached to an edge of the computing blade 10 by its attachment end, opposite to the plug-in end 132. With reference to FIGS. 3 and 4, according to one or more embodiments, a metal attachment element 160 makes it possible to attach the network card 130 to the edge of the computing blade 10, for example by screwing or blocking.

At least one embodiment of the invention makes it possible to optimize distribution of the components on either side of the cold plate 120, in particular to place the network cards 130 at the most suitable place, in particular on the opposite face of the cold plate 120 with respect to the motherboard 110. At least one embodiment of the invention thus makes it possible to obtain a computing blade 10 of low overall space and easy to maintain. In particular, by way of one or more embodiments, different network card types and models can be used since they are no longer restricted by the position of the motherboard in a card-to-card insertion configuration.

The invention claimed is:

1. A computing blade for a multi-blade supercomputer, said computing blade comprising:
a motherboard, comprising a plurality of processors mounted to a support;
a cold plate, dimensioned to cover the support of the plurality of processors, and comprising
a plurality of heat sinks,
a cooling circuit comprising channels inside which a cold heat transfer fluid that supplies the plurality of heat sinks circulates, and
a discharge circuit comprising channels inside which a hot heat transfer fluid that has heated up through the plurality of heat sinks,
wherein each heat sink of the plurality of heat sinks is mounted in line with a corresponding processor of the plurality of processors in order to cool the corresponding processor by heat exchange; and,
a plurality of network cards of a same number as said plurality of processors,
wherein each network card of said plurality of network cards is associated with a processor of said plurality of processors,
wherein said each network card comprises a plug-in end configured to receive a connector,
wherein said each network card is configured to allow data communication between said processor and another processor of said plurality of processors,
wherein said each network card is mounted to the cold plate by being connected to the motherboard via a connection system,
wherein said connection system comprises
a first connector, connected to the plug-in end of the each network card, and
a second connector, connected on one hand to the first connector via a cable and on another hand to the motherboard.

2. The computing blade according to claim 1, wherein the second connector is connected to the motherboard through the cold plate.

3. The computing blade according to claim 1, wherein said each network card is mounted to the cold plate via a support piece.

4. The computing blade according to claim 3, wherein the support piece comprises a body and a holding device that holds the first connector, mounted to said body.

5. The computing blade according to claim 4, wherein the holding device comprises a support blade that supports the first connector and a holding plate that holds the first connector on said support blade.

6. The computing blade according to claim 5, wherein the support blade is made of aluminum.

7. The computing blade according to claim 5, wherein the holding plate is made of steel.

8. The computing blade according to claim 5, wherein the holding plate is attached to the support blade using at least one screw.

9. The computing blade according to claim 8, wherein the at least one screw is captive, and mounted to the holding plate.

10. The computing blade according to claim 5, wherein the support blade is attached to the body of the support piece by being offset by a distance from the cold plate.

11. The computing blade according to claim 4, wherein the body of the support piece is made of a thermally conductive material.

12. The computing blade according to claim 11, wherein the body of the support piece is made of aluminum.

13. The computing blade according to claim 1, wherein the cable of the connection system is flexible.

14. The computing blade according to claim 1, wherein said each network card is attached on one edge of the computing blade by an attachment end, opposite to the plug-in end.

15. A supercomputer comprising:
at least one computing blade that comprises
a motherboard, comprising a plurality of processors mounted to a support;
a cold plate, dimensioned to cover the support of the plurality of processors, and comprising
a plurality of heat sinks,
a cooling circuit comprising channels inside which a cold heat transfer fluid that supplies the plurality of heat sinks circulates, and
a discharge circuit comprising channels inside which a hot heat transfer fluid that has heated up through the plurality of heat sinks, wherein each heat sink of the plurality of heat sinks is mounted in line with a corresponding processor of the plurality of processors in order to cool the corresponding processor by heat exchange; and,
a plurality of network cards of a same number as said plurality of processors,
wherein each network card of said plurality of network cards is associated with a processor of said plurality of processors,
wherein said each network card comprises a plug-in end configured to receive a connector,
wherein said each network card is configured to allow data communication between said processor and another processor of said plurality of processors,
wherein said each network card is mounted to the cold plate by being connected to the motherboard via a connection system,
wherein said connection system comprises
a first connector, connected to the plug-in end of the each network card, and
a second connector, connected on one hand to the first connector via a cable and on another hand to the motherboard.

* * * * *